(12) United States Patent
Gao et al.

(10) Patent No.: US 6,803,313 B2
(45) Date of Patent: Oct. 12, 2004

(54) METHOD FOR FORMING A HARDMASK EMPLOYING MULTIPLE INDEPENDENTLY FORMED LAYERS OF A PECVD MATERIAL TO REDUCE PINHOLES

(75) Inventors: Pei-Yuan Gao, San Jose, CA (US); Lu You, San Jose, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/256,368

(22) Filed: Sep. 27, 2002

(65) Prior Publication Data

US 2004/0061227 A1 Apr. 1, 2004

(51) Int. Cl.$^7$ .................. H01L 21/44; H01L 21/3205; H01L 21/4763; H01L 21/31; H01L 21/469
(52) U.S. Cl. .................. 438/680; 438/587; 438/761
(58) Field of Search .................. 438/587, 680, 438/761

(56) References Cited

U.S. PATENT DOCUMENTS 5,711,987 A * 1/1998 Bearinger et al. ............ 427/7
6,440,878 B1 * 8/2002 Yang et al. ................. 438/783

* cited by examiner

*Primary Examiner*—Long Pham
*Assistant Examiner*—Howard Weiss
(74) *Attorney, Agent, or Firm*—Foley & Lardner, LLP

(57) ABSTRACT

A bi-layer BARC/hardmask structure includes a layer of amorphous carbon and two or more distinct and independently formed layers of a PECVD material such as SiON formed on the amorphous carbon layer. By independently forming several layers of PECVD material, at least some pinholes that are present in the lowermost PECVD layer are closed by upper PECVD layers and therefore do not extend through all of the PECVD layers. As a result the upper surface of the uppermost PECVD layer has a lower pinhole density than the lower PECVD layer. This reduces photoresist poisoning by dopant in the amorphous carbon layer, and etching of the amorphous carbon layer by photoresist stripping chemistry.

11 Claims, 3 Drawing Sheets

METHOD FOR FORMING A HARDMASK EMPLOYING MULTIPLE INDEPENDENTLY FORMED LAYERS OF A PECVD MATERIAL TO REDUCE PINHOLES

BACKGROUND OF THE INVENTION

1. Field of the Invention

The invention pertains to fabrication of semiconductor devices, and in particular, to bi-layer hardmasks that include a plasma-enhanced chemical vapor deposition (PECVD) layer such as PECVD silicon oxynitride (SiON).

2. Background Technology

Features of semiconductor devices such as gate lines are typically patterned using a bi-layer structure that serves as a bottom antireflective coating during photoresist patterning, and that further serves as a hardmask during patterning of an underlying patternable layer. FIG. 1 shows a structure that may be employed in such processing to form a gate line of a MOSFET. As shown in FIG. 1, a semiconductor substrate 10 includes isolations 12 that define an area in which a MOSFET is to be formed. A conformal gate insulating layer 14 such as silicon oxide is formed over the substrate 10 and oxides 12. A gate conductive layer 16 such as polysilicon is deposited over the gate insulating layer 14 and will be patterned to form a gate line. Formed over the gate conductive layer 16 is a bi-layer structure that serves as a bottom antireflective coating (BARC) and as a hardmask for patterning underlying layers. The bi-layer structure includes an amorphous carbon layer 18 and a PECVD SiON capping layer 20 having a thickness of approximately 260 angstroms. The amorphous carbon layer is doped with nitrogen to improve its etch selectivity with respect to the underlying polysilicon 16. A photoresist mask 22 is formed on the SiON capping layer 20. The photoresist mask 22 is used to pattern the SiON layer 20, which in turn is used as a hardmask to pattern the amorphous carbon layer 18, which in turn is used as a hardmask to pattern a gate line from the polysilicon layer 16.

As critical dimensions of semiconductor devices shrink, the dimensions of the structures used to pattern those devices are also reduced. In the case of the bi-layer structure of FIG. 1, this is seen as a decrease in the thicknesses of the SiON and amorphous carbon components of the bi-layer. At current dimensions, such thinning can produce detrimental effects. One source of detrimental effects is the presence of "pinholes" in the PECVD capping layer. Pinholes are believed to be formed by outgassing from underlying layers during deposition of the PECVD material. For example, when SiON is formed over an amorphous carbon layer, residual hydrogen may be emitted from the amorphous carbon layer. These emissions cause localized non-uniformities in the PECVD deposition plasma, which result in reduced deposition of SiON in the vicinities of the non-uniformities. Pinholes that extend partly or entirely through the SiON layer may form at those locations.

Pinholes are a source of at least two problems. One of these problems is photoresist poisoning. As shown in FIG. 1b, a pinhole 24 enables diffusion of nitrogen dopant from the amorphous carbon layer 18 into an overlying photoresist layer 26, forming a region of poisoned photoresist 28. Poisoned photoresist exhibits reduced response to conventional photoresist development chemistries, and as a result, unwanted photoresist bodies may be left behind after development, causing undesired patterning of underlying layers during subsequent processing.

A second problem caused by pinholes is premature etching of the amorphous carbon layer during reworking of photoresist. During typical processing, photoresist layers may be applied over a bi-layer hardmask, patterned, and removed several times. As shown in FIG. 1c, during removal of photoresist, the chemistry used to strip the photoresist may pass through a pinhole and contact the underlying amorphous carbon layer, causing etching of a region 30 in the amorphous carbon. This results in the formation of anomalous patterns in the amorphous carbon that may be transferred to underlying layers during subsequent processing. Such etching has been found to occur even with pinholes that do not extend completely through the SiON layer, a phenomena known as "punch through."

Accordingly, there is a need for improved semiconductor processing techniques that reduce the detrimental effects of pinholes in PECVD materials.

SUMMARY OF THE INVENTION

In accordance with an embodiment of the invention, a bi-layer BARC/hardmask structure includes a layer of amorphous carbon and two or more distinct adjacent layers of a PECVD material such as SiON that are formed independently over the amorphous carbon. By independently forming two or more distinct layers of PECVD material, pinholes that are present in the lowermost layer may be prevented from continuing to grow during formation of the overlying layers. Thus by using several layers of PECVD material, the pinhole density at the surface of the PECVD portion of the bi-layer is decreased.

In accordance with one embodiment of the invention, a semiconductor device may be fabricated by forming an amorphous carbon layer over a patternable layer such as polysilicon, and then forming a multi-layer PECVD material over the amorphous carbon. The pinhole density of an upper surface of an upper layer of PECVD material is thus lower than a pinhole density of a lower layer of the PECVD material. A photoresist mask may then be formed over the layers of PECVD material, and a pattern of the photoresist mask may be transferred to the patternable layer. By providing multiple layers of PECVD material, pinhole density is reduced, and so photoresist poisoning and etching of the amorphous carbon layer by photoresist stripping chemistry is reduced.

The layers of PECVD material may be formed either in situ or ex situ. The PECVD material may comprise any of a variety of materials, including silicon oxynitride, silicon carbide, silicon oxide, SiCH, and SiCOH. More than two layers of the PECVD material may be used.

In accordance with another embodiment of the invention, a bi-layer hardmask structure may include multiple distinct layers of PECVD material. Therefore, the bi-layer hardmask may be incorporated into structure formed during fabrication of a semiconductor device, including a substrate comprising a patternable layer, an amorphous carbon layer formed over the patternable layer, and the PECVD material. The PECVD material may include at least a distinct lower layer and a distinct upper layer of PECVD material formed over the amorphous carbon layer, such that the pinhole density of an upper surface of the upper layer is lower than the pinhole density of the lower layer. A photoresist mask may be formed over the upper layer of PECVD material for transferring of a pattern of the photoresist mask to the patternable layer. By providing multiple layers of PECVD material, pinhole density is reduced, and so photoresist poisoning and etching of the amorphous carbon layer by photoresist stripping chemistry is reduced.

The PECVD material may comprise any of a variety of materials, including silicon oxynitride, silicon carbide, silicon oxide, SiCH, and SiCOH. More than two layers of the PECVD material may be used.

DESCRIPTION OF DRAWINGS

Embodiments of the invention are described in conjunction with the following drawings, in which.

DETAILED DESCRIPTION OF PREFERRED EMBODIMENTS

Figure 1A:
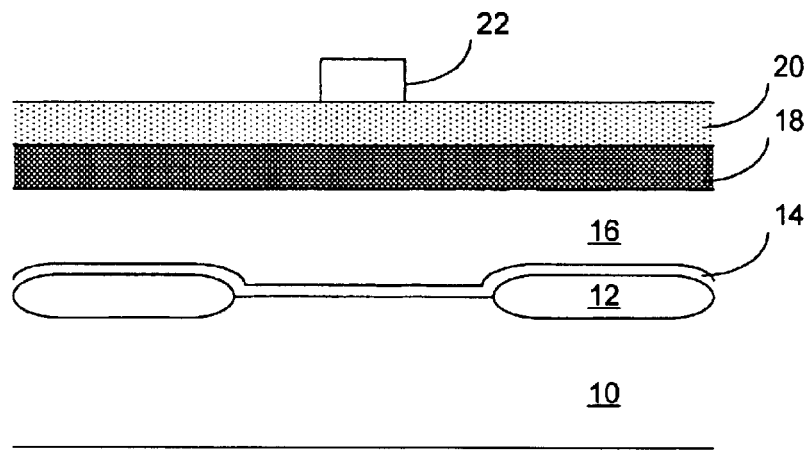
FIG. 1a shows a conventional bi-layer structure for patterning a feature of a semiconductor device.
Figure 1B:
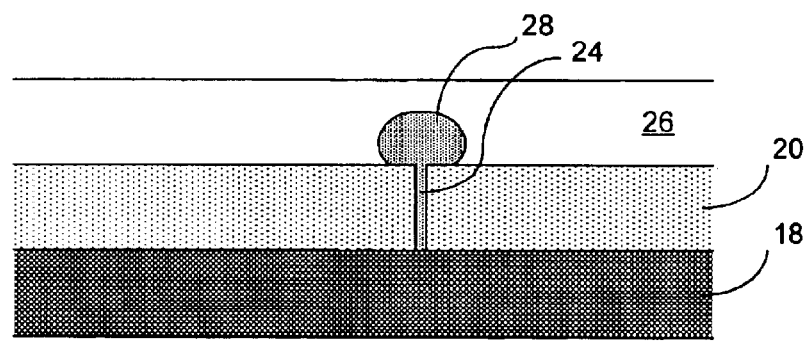
FIGS. 1b and 1c show detrimental effects caused by pinholes in a SiON layer of the conventional bi-layer.
Figure 1C:
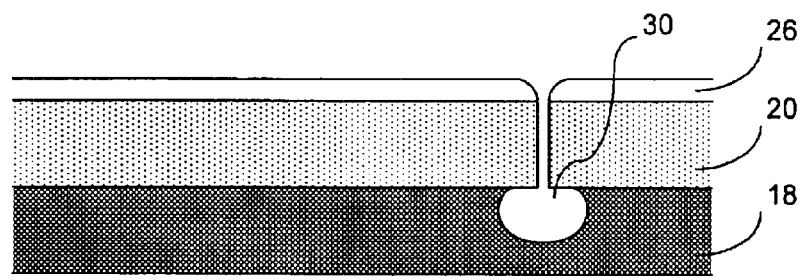
Figure 2:
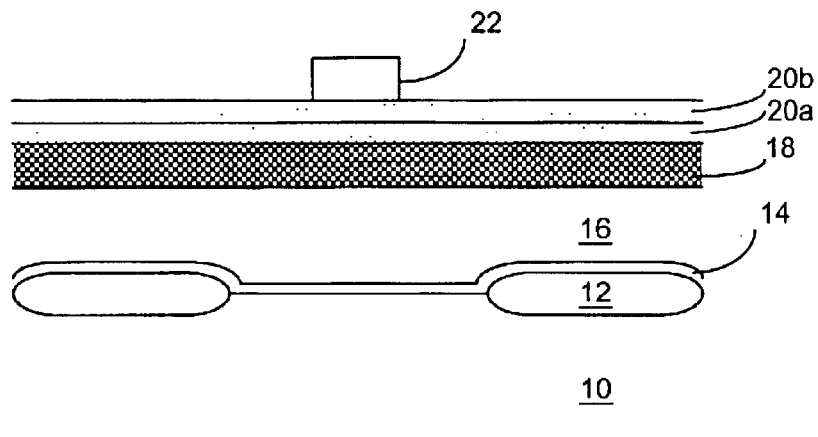
FIG. 2 shows a preferred embodiment in accordance with the invention.

FIG. 2 shows a preferred embodiment in accordance with the invention. As shown in FIG. 2, the structure is similar to the conventional structure of FIG. 1a, in that it includes a semiconductor substrate 10, isolations 12, a gate insulating layer 14, a polysilicon gate conductive layer 16, a bi-layer including an amorphous carbon layer 18 and an overlying SiON portion, and a photoresist mask 22. However, in contrast to the conventional structure, the structure of the preferred embodiment employs multiple independently formed layers 20a, 20b of SiON.

Figure 3:
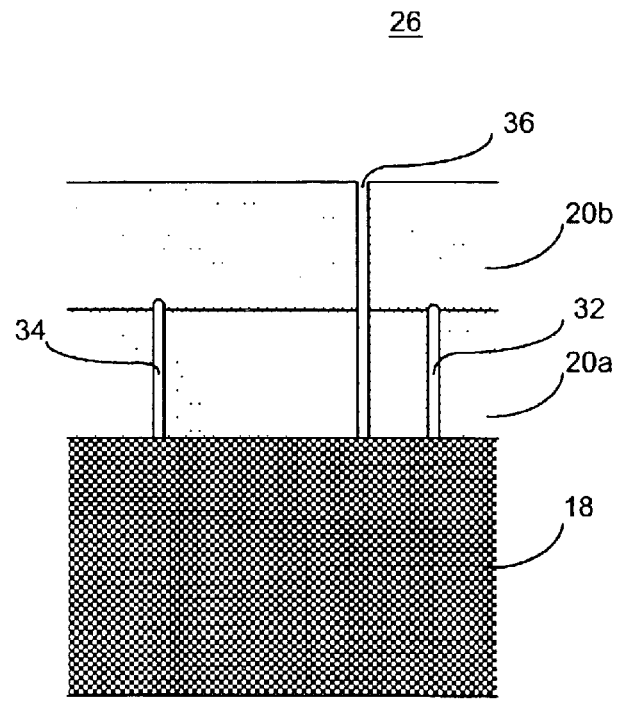
FIG. 3 shows a section of the embodiment of FIG. 2.

FIG. 3 shows the effect of multiple distinct layers of SiON on pinhole growth. As shown in FIG. 3, pinholes 32, 34, 36 that are formed during deposition of a first layer of SiON 20a extend through that layer of SiON. However, by terminating the growth of the first SiON layer 20a, and then subsequently beginning growth of another SiON layer 2b, the pinholes 32, 34 are effectively closed. Therefore, while some pinholes such as pinhole 36 may continue to grow, there is an over-all reduction in the number of pinholes that extend through both SiON layers, or that extend sufficiently through to enable photoresist poisoning or amorphous carbon etching to occur. Therefore the pinhole density at the surface of the PECVD material is reduced, providing fewer avenues for photoresist stripping chemistry to attack the underlying amorphous carbon 18, and for dopant from the amorphous carbon 18 to poison overlying photoresist 26.

The formation of multiple distinct layers may be performed using either in situ or ex situ processing. In the case of in situ processing, the layers are formed without removing the substrate from the deposition chamber. After each individual layer is formed, gas flow is shut off to extinguish the deposition plasma. Gas flow is then reestablished and the plasma is re-ignited to commence deposition of the next layer. In the case of ex situ processing, the substrate is removed from the deposition chamber after deposition of each SiON layer. In either case, the layers are distinct because they are independently formed by respective discontinuous deposition processes, and because some pinholes in lower layers are closed in the vicinity of the junctions between materials formed by the respective independent deposition processes.

The pinhole density at the surface of materials formed using multiple distinct layers as described herein may be determined by optical scattering using a KLA Tencor surface scan tool.

While the preferred embodiment of FIG. 2 employs two layers 20a and 20b of SiON, in alternative embodiments a different number of layers may be used. Moreover, the technique may be applied to other PECVD materials that may be used in a bi-layer hardmask. Examples of such PECVD materials include PECVD silicon oxide, PECVD silicon nitride, and other PECVD films such as silicon carbide, SiCH and SICOH.

Further, while the patternable layer of the preferred embodiment is a polysilicon gate layer, in alternative embodiments other patternable materials may be employed.

Figure 4:
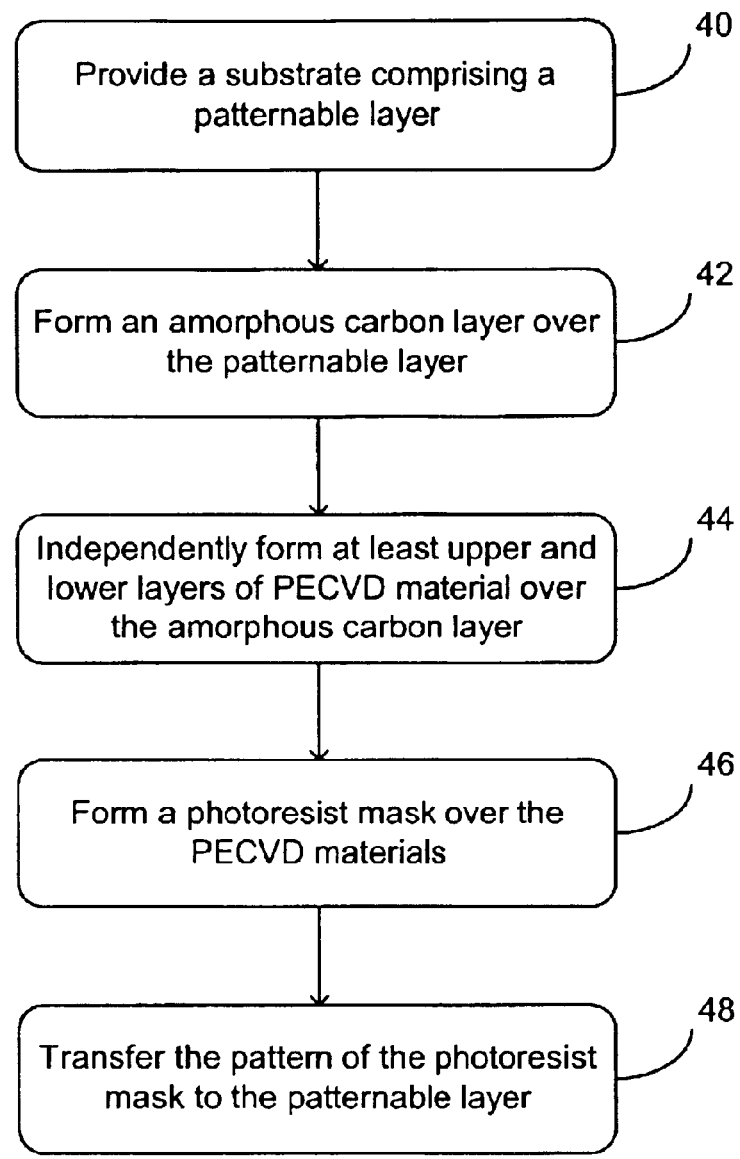
FIG. 4 shows a process flow encompassing the preferred embodiment and other alternative embodiments.

A process flow encompassing the preferred embodiment the aforementioned alternatives, and other alternative embodiments is illustrated in FIG. 4. Initially a substrate is provided (40). The substrate comprises a patternable layer. An amorphous carbon layer is then formed over the patternable layer (42). At least two distinct adjacent layers of a PECVD material are then formed independently on the amorphous carbon layer (44). The at least two PECVD layers may be formed either in situ or ex situ. A photoresist mask is then formed over the at least two PECVD layers (46), and the pattern of the photoresist mask is transferred to the patternable layer (48), such as by sequentially etching the PECVD material and the underlying materials using each material as a hardmask for patterning the underlying material.

Further processing may be performed after the processing shown in FIG. 4, such as etching of layers beneath the patternable layer such as a gate insulating layer, and formation of spacers, source and drain regions, source and drain contacts, and other types of structures.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, formation of stress relief layers between other layers, as well as other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope and spirit of the appended claims.

What is claimed is:

1. A method of fabricating a semiconductor device comprising:

providing a substrate comprising a patternable layer;

forming an amorphous carbon layer over the patternable layer;

forming a first layer of a plasma enhanced chemical vapor deposition (PECVD) material on the amorphous carbon layer;

independently forming a second layer of the PECVD material directly on the first layer, such that a pinhole density of an upper surface of the second layer is lower than a pinhole density of the first layer;

forming a photoresist mask over the uppermost layer of the PECVD material; and transferring a pattern of the photoresist mask to the patternable layer.

2. The method claimed in claim 1, wherein the first layer of the PECVD material and the second layer of the PECVD material are independently formed in situ.

3. The method claimed in claim 1, wherein the first layer of the PECVD material and the second layer of the PECVD material are independently formed ex situ.

4. The method claimed in claim 1, wherein the PECVD material comprises silicon oxynitride.

5. The method claimed in claim 1, wherein the PECVD material comprises silicon carbide.

6. The method claimed in claim 1, wherein the PECVD material comprises silicon oxide.

7. The method claimed in claim 1, wherein the PECVD material comprises SiCH.

8. The method claimed in claim 1, wherein the PECVD material comprise SiCOH.

9. The method claimed in claim 1, wherein the amorphous carbon layer is doped with nitrogen to enhance the etch selectivity of the amorphous carbon layer with respect to an underlying polysilicon patternable layer.

10. The method claimed in claim 1, wherein at least a third layer of PECVD material is independently formed directly on the second layer of the PECVD material such that a pinhole density of an upper surface of the third layer is lower than a pinhole density of the second layer.

11. The method claimed in claim 1, wherein the patternable layer comprises a polysilicon gate conductive layer.

* * * * *